(12) United States Patent
Benoit

(10) Patent No.: US 12,253,928 B2
(45) Date of Patent: Mar. 18, 2025

(54) DATA CENTER INFRASTRUCTURE OPTIMIZATION METHOD BASED ON CAUSAL LEARNING

(71) Applicant: 3M INNOVATIVE PROPERTIES COMPANY, St. Paul, MN (US)

(72) Inventor: Gilles J. Benoit, Minneapolis, MN (US)

(73) Assignee: 3M Innovative Properties Company, St. Paul, MN (US)

(*) Notice: Subject to any disclaimer, the term of this patent is extended or adjusted under 35 U.S.C. 154(b) by 551 days.

(21) Appl. No.: 17/289,983

(22) PCT Filed: Nov. 20, 2019

(86) PCT No.: PCT/IB2019/059995
§ 371 (c)(1),
(2) Date: Apr. 29, 2021

(87) PCT Pub. No.: WO2020/109937
PCT Pub. Date: Jun. 4, 2020

(65) Prior Publication Data
US 2022/0004475 A1    Jan. 6, 2022

Related U.S. Application Data

(60) Provisional application No. 62/772,131, filed on Nov. 28, 2018.

(51) Int. Cl.
*G06F 11/30* (2006.01)
*G05B 13/02* (2006.01)
(Continued)

(52) U.S. Cl.
CPC ........ *G06F 11/3089* (2013.01); *G05B 13/021* (2013.01); *G05B 13/024* (2013.01);
(Continued)

(58) Field of Classification Search
CPC .. G06F 1/206; G06F 11/3006; G06F 11/3058; G06F 11/3089; G06F 11/3409;
(Continued)

(56) References Cited

U.S. PATENT DOCUMENTS 10,180,261 B1 * 1/2019 Ross ..................... F24F 11/30
10,193,384 B2 * 1/2019 Brooks ............... H02J 3/00125
(Continued)

OTHER PUBLICATIONS

Gao, "Machine Learning Applications for Data Center Optimization," Data Centre-Google Research, (Date unknown but believed to be prior to the date of the filing of the present application.), 13 pages.
(Continued)

*Primary Examiner* — Vincent H Tran

(57) ABSTRACT

Methods for active data center management by injecting randomized controlled signals in the operational controls of the cooling infrastructure of the data center and receiving response signals corresponding with the injected signals. The injected signals are used to adjust the operational controls of the cooling infrastructure, and the response signals relate to the operational conditions in the data center. Based upon the response signals along with independent and external variables, the randomized signals are continually injected into the cooling infrastructure and fine-tuned based upon the response signals. Optimum or improved parameters for controlling the cooling infrastructure of the data center are determined based upon the signal injections and corresponding responses.

20 Claims, 6 Drawing Sheets

(51) Int. Cl.
  *G05B 15/02* (2006.01)
  *G06F 1/20* (2006.01)
  *G06F 11/34* (2006.01)
  *G06N 7/01* (2023.01)
  *H05K 7/20* (2006.01)

(52) U.S. Cl.
  CPC ......... *G05B 13/0265* (2013.01); *G05B 15/02* (2013.01); *G06F 1/206* (2013.01); *G06F 11/3006* (2013.01); *G06F 11/3058* (2013.01); *G06F 11/3409* (2013.01); *G06N 7/01* (2023.01); *H05K 7/20836* (2013.01)

(58) Field of Classification Search
  CPC ...... G06N 20/00; G05B 13/02; G05B 13/024; G05B 13/0265; H05K 7/20836
  See application file for complete search history.

(56) References Cited

U.S. PATENT DOCUMENTS

| | | | |
|---|---|---|---|
| 10,997,052 B2* | 5/2021 | Khosrowpour | G06F 11/3476 |
| 11,216,048 B1* | 1/2022 | Lin | G06F 1/324 |
| 2004/0249480 A1* | 12/2004 | Lefebvre | G06V 10/82 |
| | | | 700/52 |
| 2009/0179080 A1* | 7/2009 | Alston | B60H 1/00378 |
| | | | 392/407 |
| 2010/0314458 A1 | 12/2010 | Votaw et al. | |
| 2011/0288722 A1 | 11/2011 | Nocosia et al. | |
| 2012/0101648 A1 | 4/2012 | Federspiel et al. | |
| 2012/0232877 A1* | 9/2012 | Bhagwat | H05K 7/20836 |
| | | | 703/13 |
| 2013/0173062 A1 | 7/2013 | Koenig-Richardson | |
| 2014/0005982 A1 | 1/2014 | Bagchi et al. | |
| 2014/0039686 A1* | 2/2014 | Corbin | G05D 23/1923 |
| | | | 700/276 |
| 2014/0172753 A1* | 6/2014 | Nowozin | G06N 20/00 |
| | | | 706/12 |
| 2014/0277760 A1* | 9/2014 | Marik | F24F 11/00 |
| | | | 700/276 |
| 2014/0351183 A1* | 11/2014 | Germain | E21B 44/00 |
| | | | 706/12 |
| 2015/0316903 A1* | 11/2015 | Asmus | G06Q 10/04 |
| | | | 700/291 |
| 2016/0131382 A1 | 5/2016 | Rosen | |
| 2017/0187592 A1* | 6/2017 | Ghosh | H04L 43/0817 |
| 2017/0206467 A1* | 7/2017 | Brooks | G06Q 50/06 |
| 2017/0207624 A1* | 7/2017 | Brooks | G01R 19/2513 |
| 2017/0255688 A1* | 9/2017 | Hackett-Jones | G06F 16/285 |
| 2017/0314800 A1 | 11/2017 | Bengea et al. | |
| 2017/0366009 A1* | 12/2017 | Hansen | H02J 3/32 |
| 2018/0059745 A1 | 3/2018 | Gross et al. | |
| 2018/0204084 A1* | 7/2018 | Inoue | G06F 18/254 |
| 2018/0204116 A1 | 7/2018 | Evans et al. | |
| 2020/0008704 A1* | 1/2020 | Hansis | A61B 5/055 |
| 2020/0015389 A1* | 1/2020 | Gao | F25B 25/005 |
| 2020/0065712 A1* | 2/2020 | Wang | G06N 20/20 |
| 2020/0238587 A1* | 7/2020 | Rausch | B29C 48/303 |
| 2021/0070313 A1* | 3/2021 | Benoit | B60R 16/0236 |
| 2021/0372568 A1* | 12/2021 | Lombard | F17C 6/00 |
| 2022/0155733 A1* | 5/2022 | Brooks | G06Q 30/0202 |
| 2022/0176968 A1* | 6/2022 | Brooks | B60W 40/064 |

OTHER PUBLICATIONS

International Search Report for PCT International Application No. PCT/IB2019/059995, mailed on Feb. 28, 2020, 3 pages.

* cited by examiner

DATA CENTER INFRASTRUCTURE OPTIMIZATION METHOD BASED ON CAUSAL LEARNING

CROSS REFERENCE TO RELATED APPLICATIONS

This application is a national stage filing under 35 U.S.C. 371 of PCT/IB2019/059995 filed Nov. 20, 2019, which claims the benefit of U.S. Provisional Application No. 62/772,131, filed Nov. 28, 2018, the disclosures of which are incorporated by reference in their entireties herein.

BACKGROUND

Data centers consume a significant amount of electricity for use in cooling the servers and other computer equipment in them. As the demand for data increases, it is critical that data centers operate in an energy efficient manner. One metric is the power usage efficiency: the ratio of the energy used to run the data center infrastructure to the energy used to power the computer equipment (e.g., servers and switches). Very well optimized data centers can have annualized power utilization efficiency as low as 1; however, power utilization efficiencies of 1.3 or greater are more typical. Other metrics include revenue, return on investment, latency, and customer retention.

Optimizing the data center infrastructure cooling system process controls contextually as a function of network load and external environmental conditions, such as temperature, cloud coverage, and energy costs, is a complex problem. Advanced machine learning techniques such as convolutional neural networks have been applied to this problem to develop predictive models that can anticipate energy needs and better manage energy usage. It has been shown that this type of machine learning system can possibly achieve a 40 percent reduction in the amount of energy used for cooling, which equates to a 15 percent reduction in overall power utilization efficiency overhead after accounting for electrical losses and other non-cooling inefficiencies.

However, these machine learning techniques based on observational data all face a fundamental trade-off: the greater their complexity, the more data is required for training the model, commonly years of operational data. Considering that a typical computer equipment refresh rate is three years, this means that the machine learning model will have a short period of optimized operations before its accuracy and precision start degrading and re-training is required to reflect the updated computer equipment and infrastructure. Depending upon the magnitude of the changes, this could trigger what is known as "catastrophic forgetting" in the machine learning field, requiring the model to restart with completely new data. Thus, there is a need for more data and time efficient algorithms for identifying optimum data center control settings where the speed and quality of learning is commensurate with the speed of change in the data center infrastructure.

SUMMARY

A first method for active data center management includes injecting randomized controlled signals in the operational controls of a data center and ensuring the signal injections occur within normal operational ranges and constraints. The method also includes monitoring operational conditions and operational outcomes in the data center in response to these signal injections and computing confidence intervals about the causal relationships between the signal injections and operational outcomes contextually based on operational conditions. Optimal signals are selected for the operational controls of the data center based on the computed confidence intervals and operational conditions. In some embodiments, the optimal signals are selected by probability matching where a frequency of assignment of the signals is determined by a mean of the confidence interval and an overlap of the confidence interval with other confidence intervals.

A second method for active data center management includes providing signal injections for operational controls of a data center and receiving response signals corresponding with the signal injections. The method also includes measuring a utility of the response signals and accessing data relating to controlling operational conditions of the data center. The data for the operational controls is modified based upon the utility of the response signals.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of this invention include a method for improving data center energy efficiency by implementing random perturbation experiments on the cooling system parameters, such as cold aisle temperature set points, number and timing of cooling systems running, and chiller temperatures, and inferring their causal effects on utility metrics such as power utilization efficiency, operating cost, and radius of influence. This active experimental method can result in faster, more robust learning than passive machine learning techniques based on observational data for data center or general building energy management.

Figure 1A:
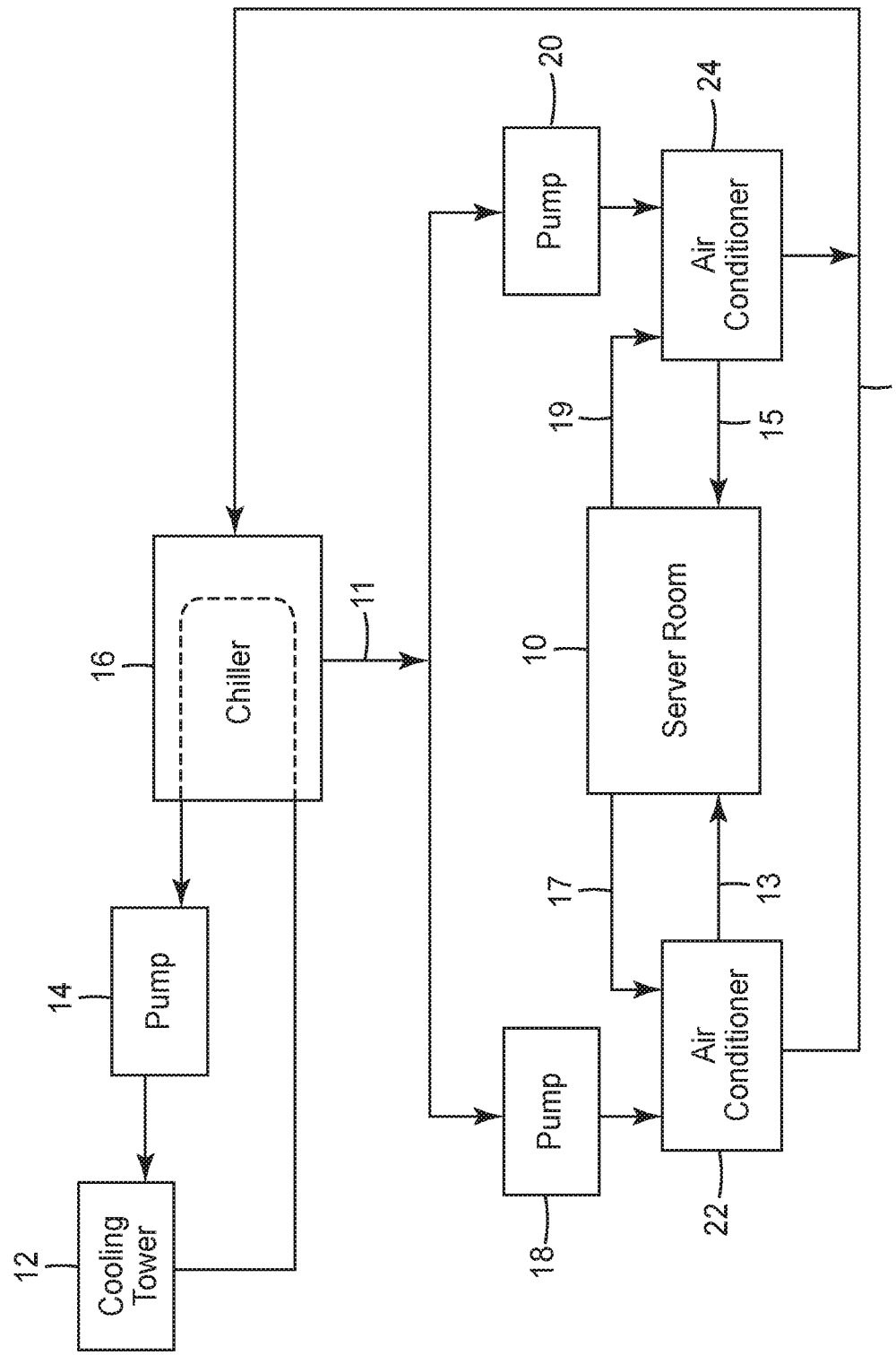
FIG. 1A is a diagram illustrating exemplary cooling infrastructure components of a data center.

FIG. 1A is a diagram illustrating exemplary cooling infrastructure components of a data center. A data center includes a server room 10 having racks of servers, storage devices, electronic switching equipment, and possibly other computer equipment. The typical cooling infrastructure includes a cooling tower 12 providing cold water to a chiller 16, which provides the cold water 11 through pumps 18 and 20 to computer room air conditioners 22 and 24. Air conditioners 22 and 24 provide fresh cold air 13 and 15 into and through server room 10 and receive exhausted hot air 17 and 19 from server room 10. Air conditioners 22 and 24 provide hot water 21 back to chiller 16, which circulates warm water back to cooling tower 12 via pump 14. The cooling infrastructure can also include a waterside economizer on hot water line 21 and airside economizers for air conditioners 22 and 24. The cooling infrastructure would typically also include fans to circulate air through server room 10 around and through the racks of equipment in server room 10. The cooling infrastructure can be replicated for additional server rooms in the data center or to accommodate expansion of the data center with additional server and computer equipment.

Figure 1B:
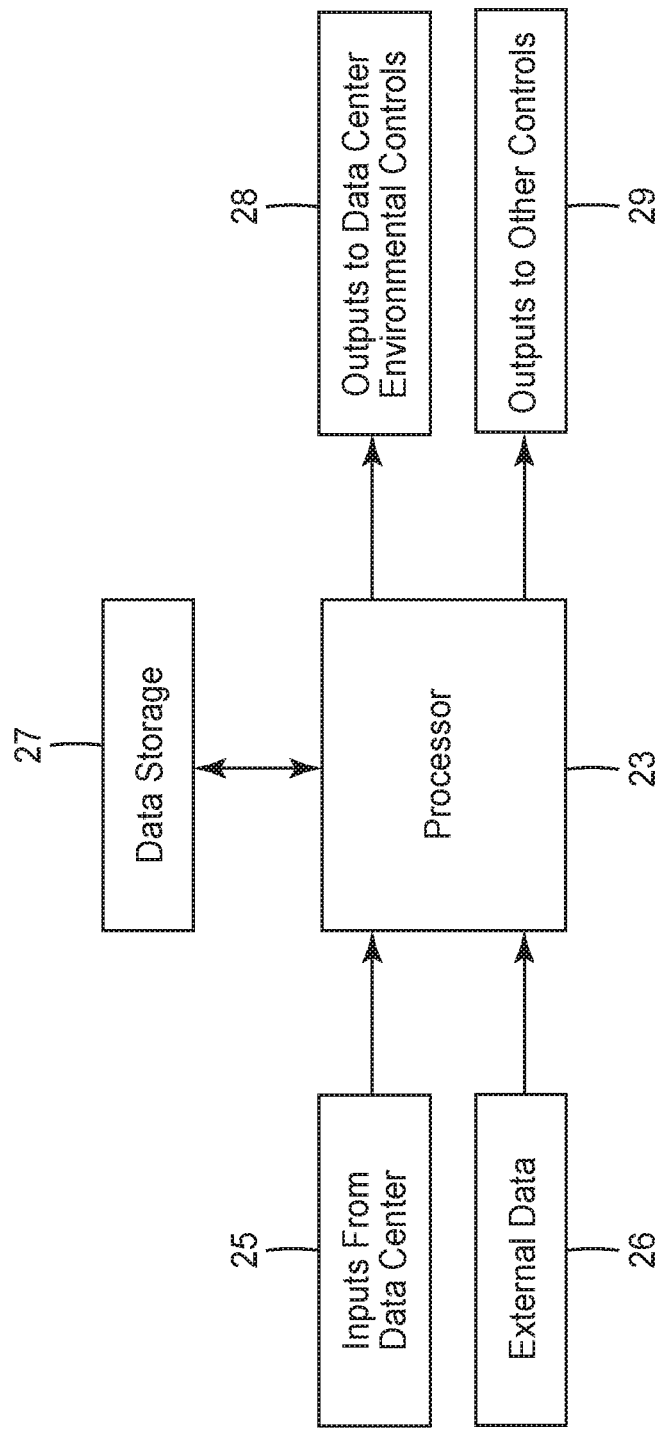
FIG. 1B is a diagram illustrating a system for implementing a data center infrastructure optimization method.

FIG. 1B is a diagram illustrating a system for implementing a data center infrastructure optimization method. The system includes a processor 23 electrically coupled to a data storage device 27. Processor 23 receives inputs 25 from the data center. In particular, processor 23 would be coupled with the cooling infrastructure components of the data center, as described with respect to FIG. 1, to provide for transmission of signals and coupled with sensors to receive signals for monitoring operational conditions in the data center. These signals could be transmitted as electrical signals (wired or wireless) or optical signals. Processor 23 can also receive external data 26 such as ambient temperature and weather conditions outside of the data center. The inputs 25 and 26 can include, for example, information quantifying or about the variables listed in Tables 3-5.

Processor 23 can process the inputs according to the causal analytics and methods described herein and provide outputs 28 to the data center operational controls to optimize or improve the data center efficiency or other utility metrics such as latency, revenue, and customer retention. In particular and based upon the methods, processor 23 can provide signals to control the data center cooling infrastructure, for example the pumps, air conditioners, chiller, and fans. Processor 23 can possibly provide outputs 29 to other controls for the data center energy efficiency.

The data center can optionally be divided into zones for optimization of the cooling infrastructure. The number and attributes of the zones can also be part of the experiments for optimization and may change dynamically over time. Each zone can be identified as a particular region of the data center, for example a portion of server room 10, and associated with inputs and controls for the zone. The inputs can be, for example, sensors that monitor operational conditions in the corresponding zone, and the controls can be cooling infrastructure components in the corresponding zone. The zones could be as granular as a single rack or a portion of a rack in the server room. Table 1 provides an exemplary data structure for storing identification of zones along with the corresponding inputs and controls.

TABLE 1

| Zones | | |
|---|---|---|
| Zone | Inputs for the Zone | Controls for the Zone |
| Zone1 | Input1a, Input1b, . . . Input1n | Control1a, Control1b, . . . Control1n |
| Zone2 | Input2a, Input2b, . . . Inputr2n | Control2a, Control2b, . . . Control2n |
| Zone3 | Input3a, Input3b, . . . Input3n | Control3a, Control3b, . . . Control3n |
| . . . | | |
| ZoneN | InputNa, InputNb, . . . InputNn | ControlNa, ControlNb, . . . ControlNn |

FIGS. 2-5 are flow charts of methods for data center infrastructure optimization. These methods can be implemented in, for example, software modules for execution by processor 23.

Figure 2:
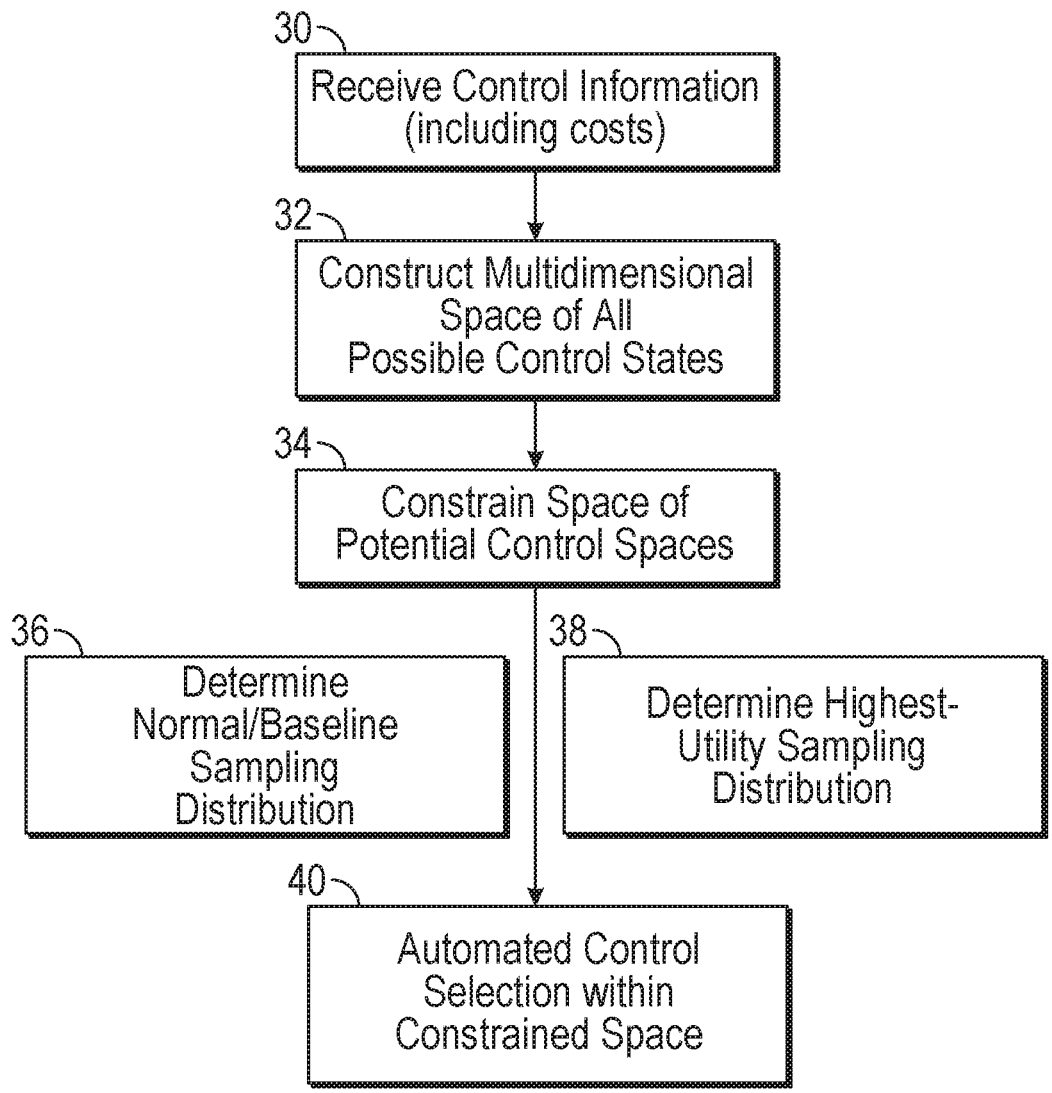
FIG. 2 is a flow chart of a search space method for the system.

FIG. 2 is a flow chart of a search space method. The search space method includes the following steps: receive control information (including costs) 30; construct multidimensional space of all possible control states 32; constrain space of potential control signals 34; determine normal/baseline sampling distribution 36 under normal conditions, equivalently historical sampling distribution; determine highest utility sampling distribution 38; and automated control selection within constrained space 40. At the beginning of a search space method, operational decisions would resemble historical patterns ("normal distribution") until sufficient evidence is obtained to exploit more optimum ones.

Figure 3:
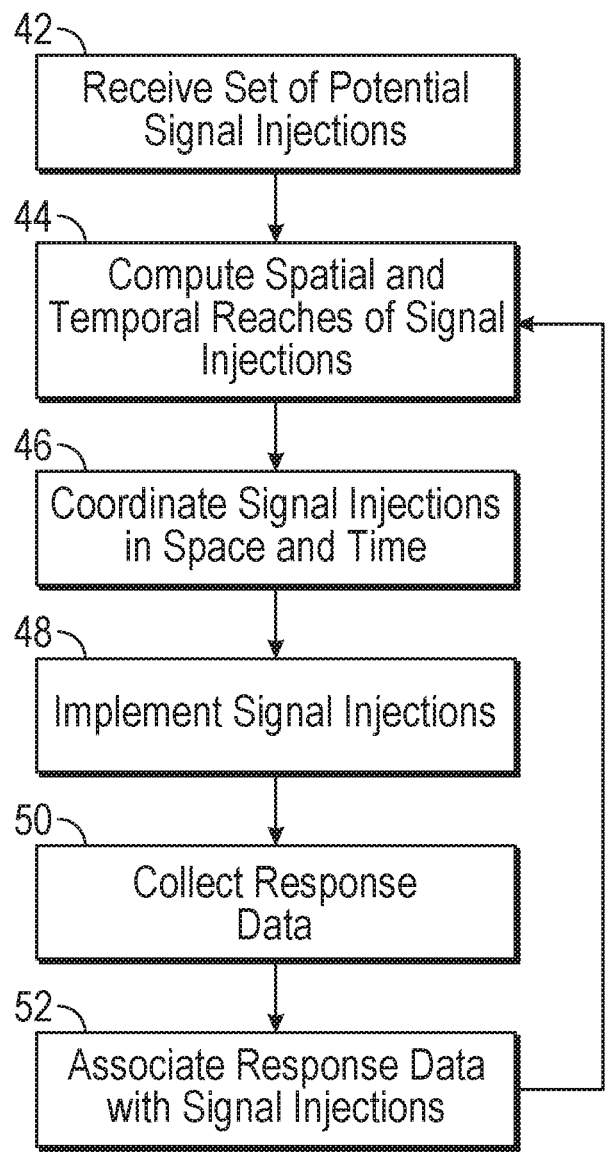
FIG. 3 is a flow chart of a signal injection method for the system.

FIG. 3 is a flow chart of a signal injection method. The signal injection method includes the following steps: receive set of potential signal injections 42; compute spatial and temporal reaches of signal injections 44; coordinate signal injections in space and time 46; implement signal injections 48; collect response data 50; and associate response data with signal injections 52.

The signal injections are changes in control parameters for data center cooling infrastructure. The responses to signal injection are typically data center performance resulting from or related to the changes in control parameters from the signal injections. For example, the algorithm can vary or modify controls and set points to obtain a desired temperature within the data center infrastructure. The temporal and spatial reaches of signal injections relate to, respectively, when and where to measure the response signals to those signal injections that are used for computing causal relationships. The spatial reach can be interpreted as the radius of influence of a particular control while the temporal reach can be interpreted as its time response, including possible delays, fluctuations and decay. The costs of signal injection relate to the costs of implementing a particular signal including fixed costs (e.g., operator cost), variable costs (e.g., energy cost) and opportunity costs (e.g., how the signal injection affects data center infrastructure performance relative to other signals) and are controlled by the specified experimental range. The queue for signal injection involves the order and priority of signal injections and relies on blocking and randomization to guarantee high internal validity at all times, even when exploiting inferred causal relationships to optimize utility. The utility of responses to signal injection involves the effectiveness of the signal injections quantified through measures of utility such as power utilization efficiency (PUE), return on investment, revenue, latency, customer retention, and possibly other factors. These metrics can further be combined into a single multi-objective optimization function.

Figure 4:
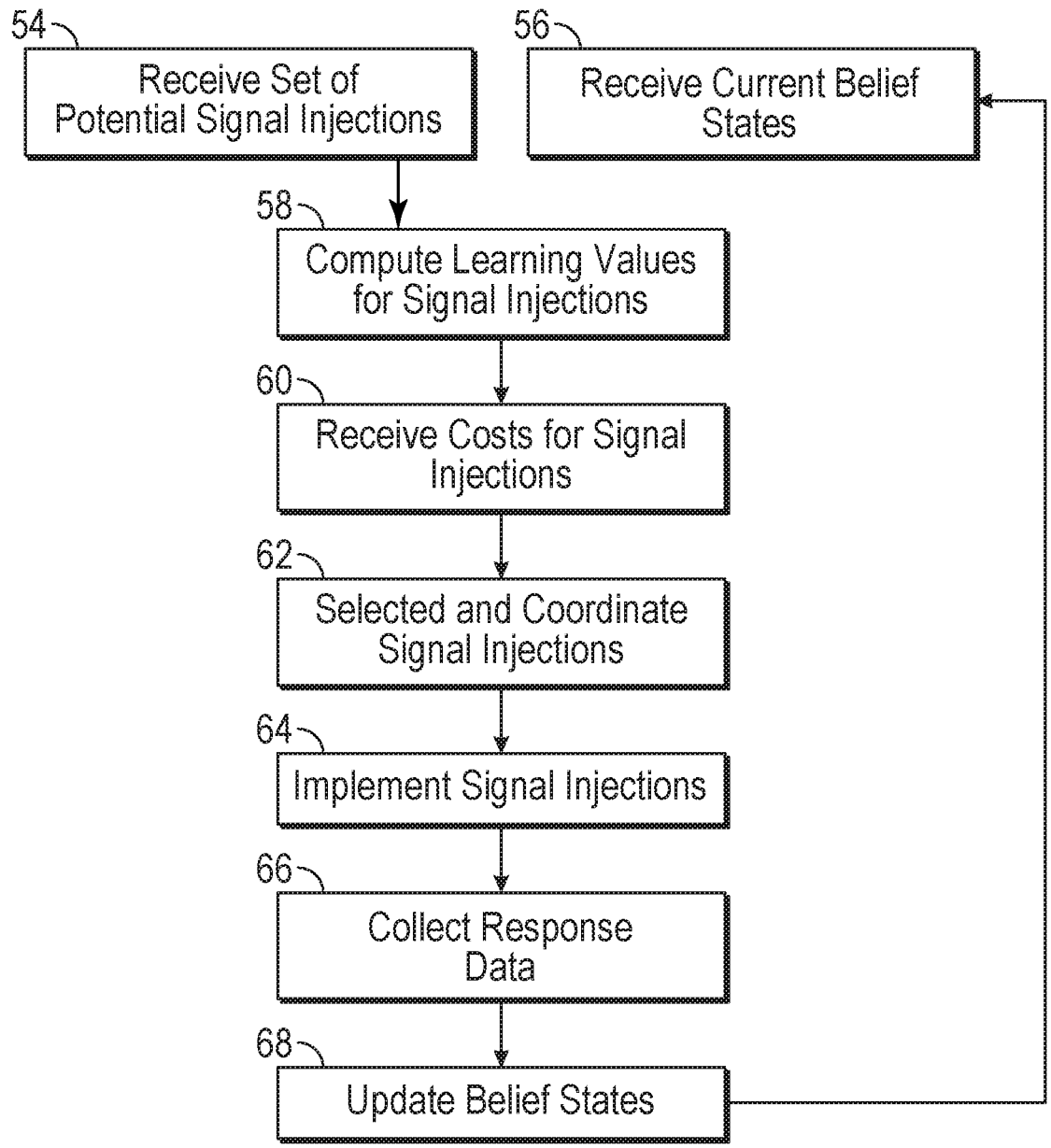
FIG. 4 is a flow chart of a continuous learning method for the system.

FIG. 4 is a flow chart of a continuous learning method. The continuous learning method includes the following steps: receive set of potential signal injections 54; receive current belief states 56; compute learning values for signal injections 58; receive costs for signal injections 60; select and coordinate signal injections 62; implement signal injections 64; collect response data 66; and update belief states 68.

The set of potential signal injection may change over time based on external and environmental factors, for example the safe search space for chiller temperature may be conditional on the external temperature. The belief states are a set of different causal models of data center cooling infrastructure performance in response to various parameters. These belief states may have attached uncertainty values reflecting the likelihood that they are accurate given the current set of trials and knowledge that may tend to confirm or falsify these different models, and the information that can further confirm or falsify the models may be included in this data or derived from the basic characteristics of the particular model and the physics of the underlying system.

The learning value is a measure of the value that knowledge generated as a result of the signal injection may provide to subsequent decision-making by a system, such as determining that a particular control parameter for a particular component of the cooling infrastructure is more likely to be optimal. The learning value may be computed through, for example, predicting the raw number of belief states that may be falsified according to the predictions of a Partially Observable Markov Decision Process (POMDP) or other statistical model, predicted impacts of the signal injection on the uncertainty levels in the belief states in such models, or experimental analyses computing the reduction in uncertainty and narrowing of confidence intervals based on increasing to the current sample size. Initially the learning value is high as the models lack precision to recommend optimum control decisions. As the confidence about the causal effects and therefore about the utility of control decisions improves over time, the marginal learning value decreases while the opportunity cost of implementing and exploiting that learning increases.

Figure 5:
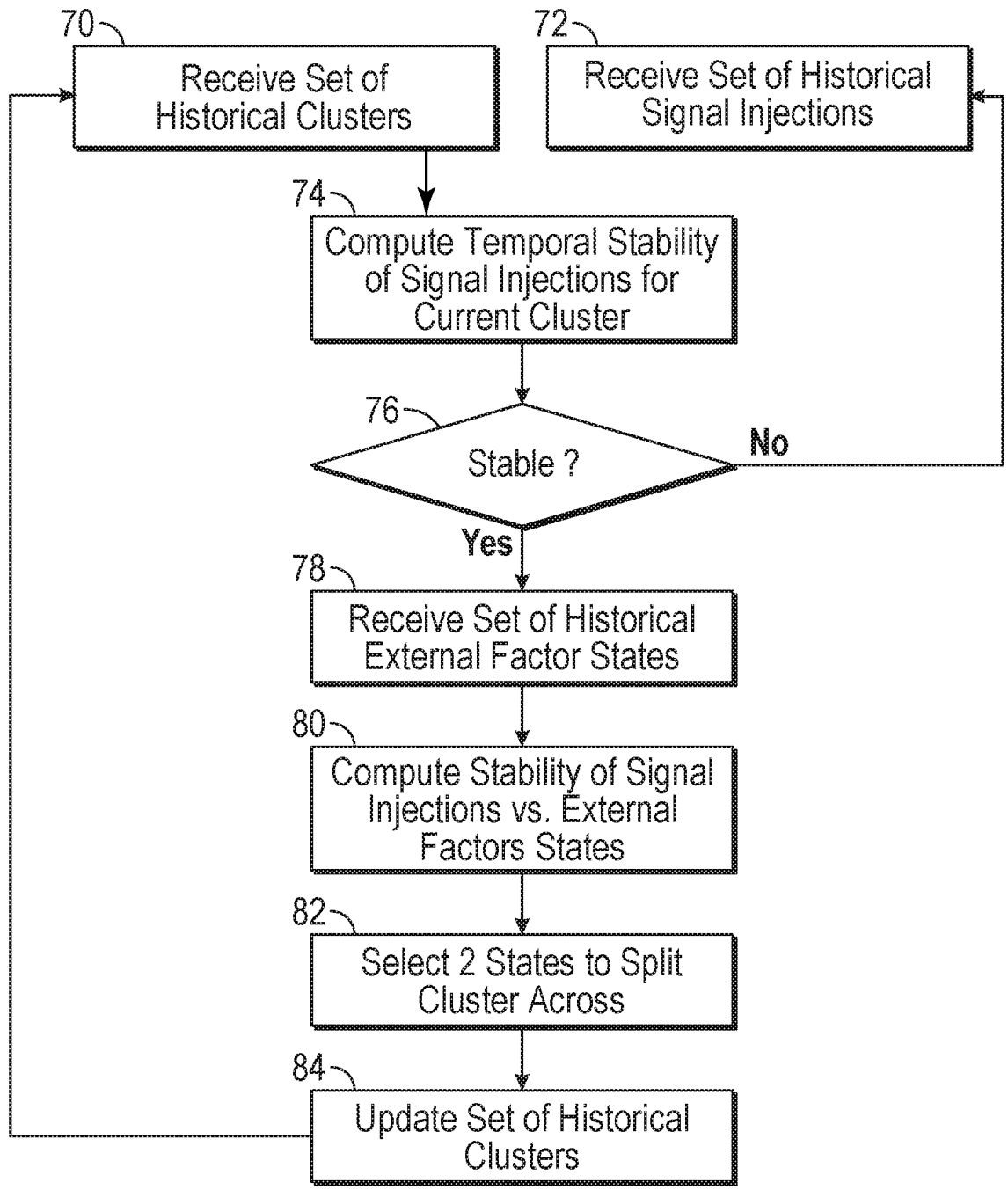
FIG. 5 is a flow chart of a memory management method for the system.

FIG. 5 is a flow chart of a memory management method. The memory management method includes the following steps: receive set of historical clusters 70; receive set of historical signal injections 72; and compute temporal stability of the effects of signal injections for current clusters 74. If the effects of signal injections from step 74 are stable 76, then the memory management method executes the following steps: receive set of historical external factor states 78; compute stability of the effects of signal injections versus external factors states 80; if variance in effects is detected across two or more clusters of external factor states and sufficient data is available within each cluster to compute confidence intervals about these effects, select two states to split cluster across 82 and update set of historical clusters 84.

A cluster is a group of experimental units that are statistically equivalent, or exchangeable, with respect to the measured effects. An experimental unit can be, for example, the entire data center, aisles or other portions or zones of the data center, or other subsets of such. Within a cluster, effects are measured free of bias from effect modifiers (e.g., environmental factors and external variables outside experimental control) and free of confounding variables due to random assignment, thus ensuring that the measured effects are representative of causation and not just mere correlations or associations. Distribution of measured effects within each cluster are approximately normally distributed, allowing for the computation of confidence intervals about their true mean. For each control set point, the average of the confidence interval bounds provides an unbiased estimate of the expected value of its causal effect within a given cluster.

Table 1 provides an algorithm of an embodiment for automatically generating and applying causal knowledge for data center infrastructure optimization. This algorithm can be implemented in software or firmware for execution by processor 23.

TABLE 2

| | |
|---|---|
| 1 | inject randomized controlled signals into data structure cooling infrastructure based upon changes in control parameters, where the controlled signal injections are subjected to blocking and clustering to eliminate effect modifiers |
| 2 | ensure signal injections occur within normal operational ranges and constraints |
| 3 | monitor data center cooling infrastructure performance and operational conditions in response to the signal injections |
| 4 | compute causal knowledge about the relationship between signal injections and monitored data center cooling infrastructure and operational conditions |
| 5 | select optimal signals for the data center cooling infrastructure based on current causal knowledge and possibly external data |

Embodiments of the invention use causal analytics rather than correlation. There are two factors that separate causation (what is relationship between an action A and an outcome Y) from correlation: confounds (L) and effect modifiers (M). In causal analytics language A=IV (independent variables), Y=DV (dependent variables), M=EV (external variables) as illustrated below.

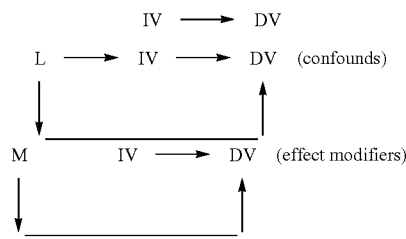

A singular mechanism to eliminate confounds (L) is randomization of action selection, which is at the core of active experimentation methods such as the causal learning described herein. Observational methods such as deep learning have no means of identifying, quantifying, and/or eliminating confounds. Effect modifiers are also eliminated by randomization in the limit of large numbers but blocking and clustering are more efficient mechanisms of eliminating their impact (reducing bias) on causal inference in small samples. Deep learning attempts to accomplish the same by allowing an algorithm to find "features" (i.e., a combination of EVs) that may be representative of effect modifiers, but finding these in the presence of confounds is quite difficult and hence why so much data is required. Furthermore, deep learning does not accommodate non-stationary systems where causal effects and effect modifiers may change over time or that may drift outside the historical operational window. In contrast, causal analytics or learning is intrinsically adaptable to non-stationary or dynamic systems as it continuously improves the accuracy and precision of its learning through active in-situ experimentation and requires a small finite amount of data most representative of the current state of the system to drive optimum control decisions.

Unlike other machine learning techniques that rely on passively collected historical data to train a model and build a "digital twin" of the physical process that delivers all the value at the end of training, causal analytics delivers value much sooner by exploiting effects with positive expected utility as soon as there is enough evidence to do so. While entitlement performance may be identical with both techniques, the cumulative value delivered by causal analytics over time is much greater. This also means that causal analytics can be deployed in new systems that have very limited amounts of historical operational data. Conversely, if a digital twin already exists, causal analytics could be initialized by experimenting on the digital twin, and the accuracy and precision of the learning could then be refined by experimenting in situ. In addition, causal analytics is much less susceptible to "catastrophic forgetting" because it is never in a pure exploit phase 100% of the time and continuously monitors whether causal effects are stable over time.

Unlike typical closed loop control systems which rely on the diagonal elements ($M_{ii}$) of the control response matrix, the causal analytics technique allows precise quantification of all the matrix elements (including the non-diagonal interaction elements) in a complex control system. In this formalism, the causal response elements M, are determined through responses to the randomized signal injections into the data center cooling infrastructure and are not simple numerical coefficients but rather complex non-linear functions of time, space, independent variables (different elements for different levels or set points) and external factors (different elements for different clusters). Those causal elements are also monitored over time and then used to refine or determine new signal injections. Quantification of the confidence interval around the expected values of these matrix elements further allows for operational risk estimation and therefore risk-adjusted optimization of control decisions.

The matrices below provide examples of matrix elements for data center optimization. Matrix elements ($M_{ij}$) can be quantified for target temperatures in zones ($T_{z1}$, $T_{z2}$, $T_{z3}$) based upon controls ($Ctrl_1$, $Ctrl_2$, $Ctrl_3$). Matrix elements ($M_{ij}$) can be quantified for costs ($Cost_1$, $Cost_2$, $Cost_3$) based upon controls ($Ctrl_1$, $Ctrl_2$, $Ctrl_3$). Matrix elements ($M_{ij}$) can also be quantified for operational goals ($OpGoal_1$, $OpGoal_2$, $OpGoal_3$) based upon policies ($Policy_1$, $Policy_2$, $Policy_3$). The matrices can be expanded (or reduced) for more or fewer elements.

$$\begin{bmatrix} T_{z1} \\ T_{z2} \\ T_{z3} \end{bmatrix} = \begin{bmatrix} M_{11} & M_{12} & M_{13} \\ M_{21} & M_{22} & M_{23} \\ M_{31} & M_{32} & M_{33} \end{bmatrix} \begin{bmatrix} Ctrl_1 \\ Ctrl_2 \\ Ctrl_3 \end{bmatrix}$$

$$\begin{bmatrix} Cost_1 \\ Cost_2 \\ Cost_3 \end{bmatrix} = \begin{bmatrix} M_{11} & M_{12} & M_{13} \\ M_{21} & M_{22} & M_{23} \\ M_{31} & M_{32} & M_{33} \end{bmatrix} \begin{bmatrix} Ctrl_1 \\ Ctrl_2 \\ Ctrl_3 \end{bmatrix}$$

$$\begin{bmatrix} OpGoal_1 \\ OpGoal_2 \\ OpGoal_3 \end{bmatrix} = \begin{bmatrix} M_{11} & M_{12} & M_{13} \\ M_{21} & M_{22} & M_{23} \\ M_{31} & M_{32} & M_{33} \end{bmatrix} \begin{bmatrix} Policy_1 \\ Policy_2 \\ Policy_3 \end{bmatrix}$$

Control examples ($Ctrl_i$) for target temperatures in zones ($T_{zi}$) include fan speeds, temperatures cooling water temperature, and water flow. Control examples ($Ctrl_i$) for costs ($Cost_i$) include energy sources, energy storage, and load distribution across servers. Policy examples ($Policy_i$) for operational goals ($OpGoal_i$) include deployment, maintenance and decommissioning of equipment, and task prioritization.

The following are benefits of a causal analytics experimental approach to data center control and design.

Health monitoring and diagnosis: Monitor causal elements M over time as health indicators for preventive maintenance (i.e., changes in causal effects M may indicate physical changes in the equipment).

Control decision optimization: Prescribe the optimum combination of controls to maintain safe local temperatures at the lowest cost; determine an optimum temperature for each zone of the data center; monitor cost basis estimators for different controls and energy sources for energy portfolio optimization (e.g., varying energy costs during days or seasons or years); use time delay of matrix elements to optimize the time sequence of actions for greater responsiveness and stability (e.g., reduced temperature fluctuations); and determine where to direct network traffic among the servers based at least in part on the heat load among the servers or other equipment.

Sizing and placement optimization: Use matrix elements to estimate the radius of influence of each control or device and identify gaps and/or redundancies in the system; and use matrix elements to estimate the marginal return on investment for additional control devices or alternative infrastructure configurations.

The causal analytical experimental approach can also be applied to data center management as follows.

Effectiveness monitoring and diagnosis: Use matrix elements to measure policy effectiveness over time and eliminate policies with poor performance and/or low savings.

Policy optimization: As examples, prescribe the optimum local temperature control policy (target temperatures in each zones $T_{zi}$) to minimize energy consumption (short-term costs) and maximize equipment lifetime (long-term costs); optimize the sequence and/or priority of maintenance tasks to minimize operational disruptions/risk; and optimize the investment strategy for each zone and for expansion of the data center.

Guiding and testing new policies: Use matrix sparsity as an indicator of resource gaps and redundancies to guide future investment strategies; and continuously design and test new operational and investment policies as assumptions, resources, demand, and equipment change.

While the matrix representation used above is a formalism for describing how causal analytics differs from other techniques and delivers value, causal analytics does not require causal relationships between controls and performance metrics (e.g., temperature sensors) to be linear or follow any particular distribution. Effectively, causal analytics computes different coefficients M of each level of the control variables.

Embodiments of the invention are applied to data center power utilization efficiency optimization as follows. First, the independent control variables, preferably all of them, as well as external variables are identified. Typical operating ranges for the independent control variables are identified, for example using historical sensor data. Unlike other techniques, variables can be added at any time, for example adding new control variables to reflect changes in the control infrastructure, and can be discarded, for example removing external variables that are shown to have no effect to simplify the model.

Tables 3-5 provide, respectively, examples of external variables, independent variables, and dependent variables.

TABLE 3

Examples of External Variables (EVs)

Total server information technology (IT) load [kW]
Outside air wet bulb (WB) temperature [F.]
Total server IT load [kW]
Outside air wet bulb (WB) temperature [F.]
Outside air dry bulb (DB) temperature [F.]
Outside air enthalpy [kJ/kg]
Outside air relative humidity (RH) [%]
Outdoor wind speed [mph]
Outdoor wind direction [deg]

TABLE 4

Example Independent Variables (IVs)

Total number of process water pumps (PWP) running
Mean PWP variable frequency drive (VFD) speed [%]
Total number of condenser water pumps (CWP) running
Mean CWP variable frequency drive (VFD) speed [%]
Total number of cooling towers running
Mean cooling tower leaving water temperature (LWT) setpoint [F.]
Total number of chillers running
Total number of dry coolers running
Total number of chilled water injection pumps running
Mean chilled water injection pump setpoint temperature [F.]
Mean heat exchanger approach temperature [F.]
Cold aisle temperature minimum set point [F.]
Maximum temperature allowed for CPU or other sensitive components on the board
Parameters related to the scheduling of loads to individual servers distributed within the data center

TABLE 5

Potential Dependent Variables (KPIs)

Total computer energy use
Total infrastructure energy use
Power utilization efficiency
Voltage phase imbalance For each independent variable, experimental ranges are defined within which an operator believes that changing the set point has no adverse effects on data center operations. These ranges are not necessarily fixed in time but can vary based on external/environmental factors, for example weather conditions. In this case, casual effects are computed by comparing outcomes associated with experiments implemented within each distinct search space to ensure positivity. A series of experiments are executed varying the settings of each independent variable while monitoring the effect on the Key Performance Indicators (KPIs). As causal relationships between IVs and KPIs are identified, the algorithm gradually exploits the preferred setting more frequently. Initially, changes in external variables that may modify the relationship between an IV and a KPI will result in the system exploring system settings more frequently. However, as clusters are identified where one external condition has a preferred set of IV settings different from a second external condition, the system will learn and contextually exploit the most preferred settings for the particular external condition that is occurring. The algorithm can work with a combination of independent and closed controls. For example, the fan speed on individual servers can be controlled directly by the central processing unit (CPU) temperature for that server. However, the effectiveness in reducing the CPU temperature to the desired level will depend on the cold aisle temperature as well as the thermal load from nearby devices.

The application of causal analytics is not limited to air cooled data centers. A similar complex control loop may exist for immersion cooling tanks and chillers to minimize fluid loss while maximizing cooling efficiency.

The invention claimed is:

1. A method for active data center management, comprising steps of:
    injecting randomized controlled signals into operational controls of a data center;
    ensuring the signal injections occur within normal operational ranges and constraints;
    monitoring performance of operational conditions in the data center in response to the controlled signals;
    computing confidence intervals about the causal relationships between the operational conditions and the controlled signals; and
    selecting optimal signals for the operational controls of the data center based on the computed confidence intervals, wherein selecting further comprises selecting the optimal signals by probability matching where a frequency of assignment of the signals is determined by a mean of the confidence interval and an overlap of the confidence interval with other confidence intervals.

2. The method of claim 1, wherein the injecting further comprises injecting the controlled signals to adjust parameters of cooling infrastructure for the data center.

3. The method of claim 1, wherein the operational conditions comprise a temperature in the data center.

4. The method of claim 1, wherein the injecting further comprises injecting the controlled signals into particular zones of the data center.

5. The method of claim 1, wherein the normal operational ranges comprise a multidimensional space of possible control states generated based on control information and operational constraints.

6. The method of claim 1, wherein the selecting further comprises selecting the optimal signals based upon external data.

7. The method of claim 1, wherein the injecting further comprises blocking and balancing the randomized controlled signals across external variable states and minimizing carry over effects based on the measured spatial and temporal reach of effects.

8. The method of claim 1, further comprising monitoring the performance over space and time.

9. The method of claim 1, wherein the computing further comprises computing the confidence intervals within clusters to eliminate effect modifiers.

10. The method of claim 1, wherein the signal injections have a spatial reach.

11. The method of claim 1, wherein the signal injections have a temporal reach.

12. A method for active data center management, comprising:
    providing signal injections for operational controls of cooling infrastructure of a data center, wherein each signal injection comprises a temporal reach and a spatial reach to compute causal relationships, wherein the spatial reach of each signal injection is a radius of influence of a particular control and the temporal reach of each signal injection is the response time of each signal injection comprising delays, fluctuations, and decay;
    receiving response signals corresponding with the signal injections and operational conditions in the data center;
    measuring a utility of the response signals;
    accessing data relating to parameters for the operational controls of the cooling infrastructure of the data center; and
    modifying the data for the operational controls based upon the utility of the response signals.

13. The method of claim 12, wherein the providing further comprises adjusting parameters of the cooling infrastructure for the data center.

14. The method of claim 12, wherein the receiving further comprises receiving a temperature in the data center.

15. The method of claim 12, wherein the providing further comprises providing the signal injections into particular zones of the data center.

16. The method of claim 12, wherein the modifying further comprises modifying the data for the operational controls based upon external data.

17. The method of claim 12, wherein the signal injections are randomized.

18. At least one non-transitory data storage device storing instructions that, when executed, configure at least one processor to:
providing signal injections for operational controls of cooling infrastructure of a data center, wherein each signal injection comprises a temporal reach and a spatial reach to compute causal relationships, wherein the spatial reach of each signal injection is a radius of influence of a particular control and the temporal reach of each signal injection is the response time of each signal injection comprising at least one of delays, fluctuations, and decay;
receive response signals corresponding with the signal injections and operational conditions in the data center;
measure a utility of the response signals;
access data relating to parameters for the operational controls of the cooling infrastructure of the data center; and
modify the data for the operational controls based upon the utility of the response signals.

19. The at least one non-transitory data storage device of claim 18, wherein the providing further comprises providing the signal injections into particular zones of the data center.

20. The at least one non-transitory data storage device of claim 18, wherein the signal injections are randomized.

* * * * *